United States Patent
Hsiao

(10) Patent No.: US 6,291,286 B1
(45) Date of Patent: Sep. 18, 2001

(54) TWO-STEP STRAP IMPLANTATION OF MAKING DEEP TRENCH CAPACITORS FOR DRAM CELLS

(75) Inventor: Chia-Shun Hsiao, Hsinchu (TW)

(73) Assignees: ProMOS Technology, Inc; Mosel Vitelic Inc, both of Hsinchu (TW); Siemens AG, Munich (DE)

( * ) Notice: Subject to any disclaimer, the term of this patent is extended or adjusted under 35 U.S.C. 154(b) by 0 days.

(21) Appl. No.: 09/200,912

(22) Filed: Nov. 27, 1998

(51) Int. Cl.⁷ .............................................. H01L 21/8234
(52) U.S. Cl. ............................................. 438/238; 438/247
(58) Field of Search ..................................... 438/238, 239, 438/241, 243, 253, 242, 386, 396, 397, 247

(56) References Cited

U.S. PATENT DOCUMENTS 5,075,248 * 12/1991 Yoon et al. ............................ 437/52
5,869,396 * 2/1999 Pan et al. ............................. 438/647

* cited by examiner

Primary Examiner—David Nelms
Assistant Examiner—Quoc Hoang
(74) Attorney, Agent, or Firm—W. Wayne Liauh

(57) ABSTRACT

A method of fabricating deep trench capacitors of high density Dynamic Random Access Memory (DRAM) cells is disclosed: first, providing a semiconductor substrate, and then forming a trench on the semiconductor substrate; sequentially forming a capacitor dielectric layer, a first polysilicon storage node, dielectric collars and a second polysilicon stud inside the trench; performing two-step ion implantation to form shallow and deep strap regions on one side of the trench; forming a third polysilicon layer and an isolation layer overlaying the dielectric collars and second polysilicon stud inside the trench to complete a buried strap formation; and forming an access field effect transistor on the semiconductor substrate.

10 Claims, 4 Drawing Sheets

US 6,291,286 B1

TWO-STEP STRAP IMPLANTATION OF MAKING DEEP TRENCH CAPACITORS FOR DRAM CELLS

BACKGROUND OF THE INVENTION (1) Field of the Invention

The present invention relates to a method of fabricating trench capacitor cell, and more particularly to a two-step ion implantation process for forming trench capacitor straps.

(2) Description of the Related Art

A DRAM cell comprises a metal-oxide-semiconductor field effect transistor (MOSFET) and a capacitor which are built on a semiconductor silicon substrate. There is an electrical contact between the drain of a MOSFET and the storage node of the associated capacitor, forming a memory cell of the DRAM device. A large number of memory cells make up the cell arrays which combine with the peripheral circuit to construct DRAMs.

In recent years, the sizes of the MOSFETs and capacitors have become continuously smaller so that the packing densities of these DRAM devices have increased considerably. For example, a number of semiconductor manufacturing companies in the world have already begun mass production of 64 M bit or even 256 M bit DRAMs.

There are two types of the capacitors currently used for DRAM applications: stack capacitors and trench capacitors. As the sizes of the capacitors become smaller, so as the capacitance values of the capacitors are decreasing, that reduces the signal to noise ratio of the DRAM circuits, causing performance and reliability problems. The issue of maintaining or even increasing the surface area of the storage nodes or reducing the thickness of the dielectric layer is particularly important as the density of the DRAM arrays continues to increase for future generations of memory devices. When fabricating capacitors employed for 16 Mbit DRAMs and beyond, increasing stack capacitor surface area becomes a top priority. Various shapes of stack capacitor structures have been used to address this issue. U.S. Pat. No. 5,185,282 to Lee et al. (the entire disclosure of which is herein incorporated by reference) provides a method of fabricating cup-shaped capacitor storage node. Another U.S. Pat. No. 5,021,357 to Taguchi et al. (the entire disclosure of which is herein incorporated by reference) supplies a method of fabricating fin structure capacitor electrode. These stack capacitor structures can effectively increase the capacitance values of the capacitors, however their manufacturing processes are too complicated and highly fastidious. They are difficult to be practically utilized for mass-production. Most recently, H. Watanabe et al. in the paper "A new cylindrical capacitor using hemispherical grained Si (HSG-Si) for 256 Mb DRAMs" IEDM 92, pp. 259–262 (the entire disclosure of which is herein incorporated by reference) discloses a method of fabricating cylindrical stack capacitor electrode.

However, due to the already high density of the existing semiconductor devices little room is available for stack capacitors. Moreover, due to the high device density and minimum feature size it is necessary for processing sequences to be compatible with an ever increasing range of structures and materials. Therefore, trench capacitors with buried strap become a better choice for high density DRAM applications. U.S. Pat. No. 5,395,786 to Louis Hsu et al. of IBM and U.S. Pat. No. 4,694,561 to Lebowitz et al. of AT&T (the entire disclosures of which are herein incorporated by reference) both provide a method of fabricating trench capacitors. The trench capacitor structure has a major portion of its plates extending into rather than along the surface of a chip. The amount of the surface area required per capacitor is only the area of the trench at the surface of the chip that allows more densely packed DRAM arrays.

Referring now more particularly to FIG. 1, there is shown a typical trench capacitor structure according to the prior art. First, an oxide layer and a nitride layer (not shown in the figure) are sequentially formed on a semiconductor silicon substrate 10. The oxide layer and nitride layer are then partially etched to open a process window for forming a trench by conventional lithography and plasma-etching techniques. Then, the exposed silicon substrate is also etched to form a trench. Next, an oxide/nitride/oxide (ONO) capacitor dielectric layer 19 is deposited inside the trench. A first polysilicon layer 20 as storage node is then deposited to fill the bottom of the trench. Thereafter, dielectric collars 22 are formed on the interior sidewalls of the trench. A second polysilicon layer 24 is next deposited inside the trench and aligned with the dielectric collars. Next, the second polysilicon is chemical mechanically polished or etchback to form a second polysilicon stud 24 inside the trench. The dielectric collars 22 are then recessed to expose the contact area for the capacitor. Finally, a third polysilicon layer 26 and an isolation layer 28 are deposited and polished overlaying the second polysilicon stud to complete the trench capacitor formation. Following trench capacitor formation, an access transistor consisting of gate oxide 12, gate 14, source/drain 18, and cap dielectric layer 16 are formed to finish a DRAM cell formation. The charges are therefore flown through a path 30 between the trench capacitor and access transistor to charge or discharge the capacitor, that is, performing data writing and reading functions of a DRAM cell.

However, there are some performance concerns over the conventional trench capacitor structure due to undesired collar dielectric isolation ability. The poor retention performance associated with the trench capacitor and strap of a DRAM cell is mainly due to the junction leakage. This is attributed to the collar recesses excessive to the source/drain 18 junction depth. According to the process of the prior art, only a single strap implantation is performed to extend the source/drain 18 junction depth of the access transistors that was found to be inferior. Either large leakage current through a path 29 caused by shallow source/drain 18 junction depth, or large contact resistance caused by deep source/drain 18 junction depth that degrade the DRAM performance.

Therefore, the present invention discloses an easy and manufacturable method to fabricate trench capacitors for high density DRAM applications that can eliminate the above-mentioned problems.

SUMMARY OF THE INVENTION

According, it is a primary object of the present invention to provide an easy and manufacturable method to fabricate trench capacitors for high density DRAM applications.

It is another object of the present invention to provide a method of fabricating a trench capacitor structure that can eliminate both the junction leakage current and contact resistance problems of the prior art.

It is a further object of the present invention to provide a method of fabricating a trench capacitor structure to enhance the performance of DRAMs.

These objects are accomplished by the fabrication process described below.

First, an $N^+$ buried plate well region is formed on a P-type semiconductor silicon substrate. Then, the silicon substrate is etched to form a trench. Next, a capacitor dielectric layer is deposited inside the trench. A first polysilicon layer as storage node is then deposited to fill the bottom of the trench. Thereafter, dielectric collars are formed on the interior sidewalls of the trench. Next, a second polysilicon stud is formed inside the trench. Dielectric collars are then recessed to expose the contact area for the trench capacitor and the strap formed in subsequent step. Next, two-step ion implantation is performed to form shallow strap and deep strap regions on one side of the trench.

Thereafter, a third polysilicon layer is deposited overlaying the dielectric collars and second polysilicon stud inside the trench. Finally, a shallow trench isolation (STI) layer is formed overlaying the third polysilicon layer to complete a buried strap formation of trench capacitor.

Following trench capacitor formation, an access transistor consisting of gate oxide, gate, and source/drain are formed to finish a DRAM cell formation. The trench capacitor with buried strap according to the present invention is accomplished.

Alternatively, the two-step ion implantation of the present invention can be employed to form a trench capacitor with surface strap to achieve the same effect.

BRIEF DESCRIPTION OF THE DRAWINGS

The accompanying drawings forming a material part of this description, in which:

FIG. 2 shows the cross-sectional view of the substrate after the second polysilicon stud is formed inside the trench according to the present invention.

FIG. 3 shows the cross-sectional view of the substrate after a trench capacitor with buried strap is formed according to the present invention.

FIG. 4 shows the cross-sectional view of the substrate after an access transistor of a DRAM cell is formed according to the present invention.

DESCRIPTION OF THE PREFERRED EMBODIMENT

The invention disclosed herein is directed to a method of fabricating deep trench capacitors of DRAMs. The figures are provided to illustrate a partially completed integrated circuit device. In the following description, numerous details are set forth in order to provide a thorough understanding of the present invention. It will be appreciated by one skilled in the art that variations of these specific details are possible while still achieving the results of the present invention. In other instance, well-known processing steps are not described in detail in order not unnecessarily to obscure the present invention.

Figure 1:
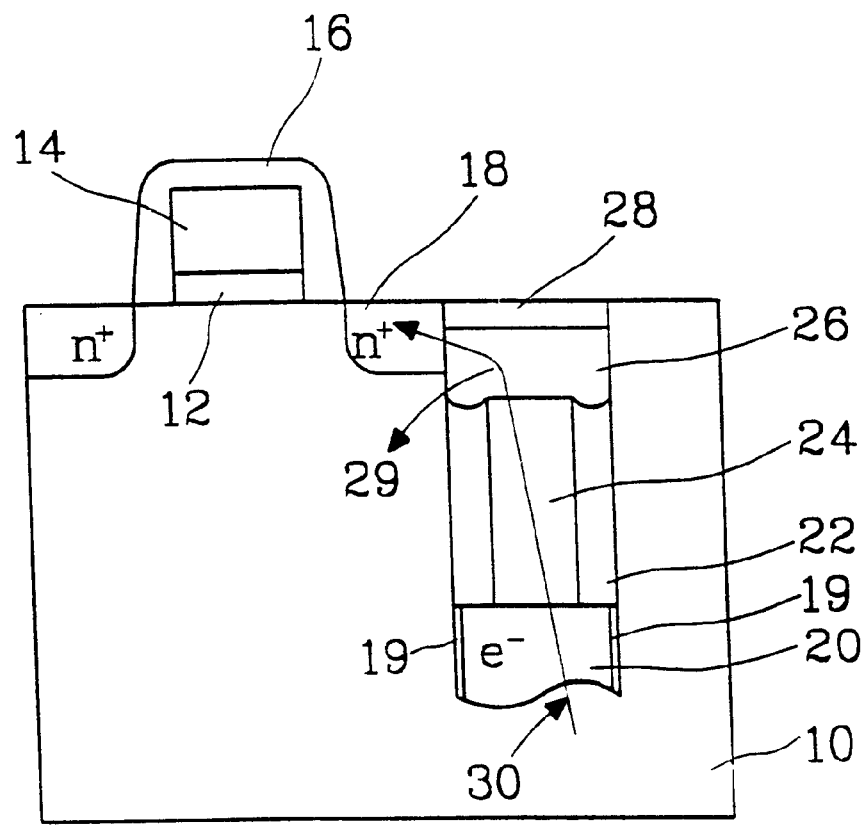
FIG. 1 illustrates the trench capacitor structure according to the prior art.
Figure 2:
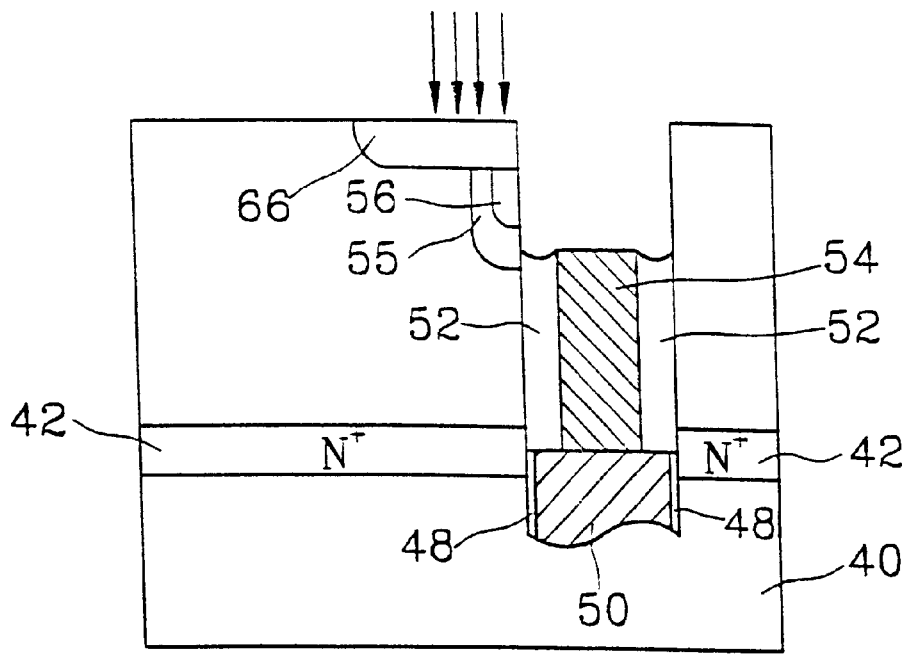
FIGS. 2 to 4 schematically illustrate the process sequences for making a trench capacitor with buried strap for a DRAM cell according to the present invention.
Figure 3:
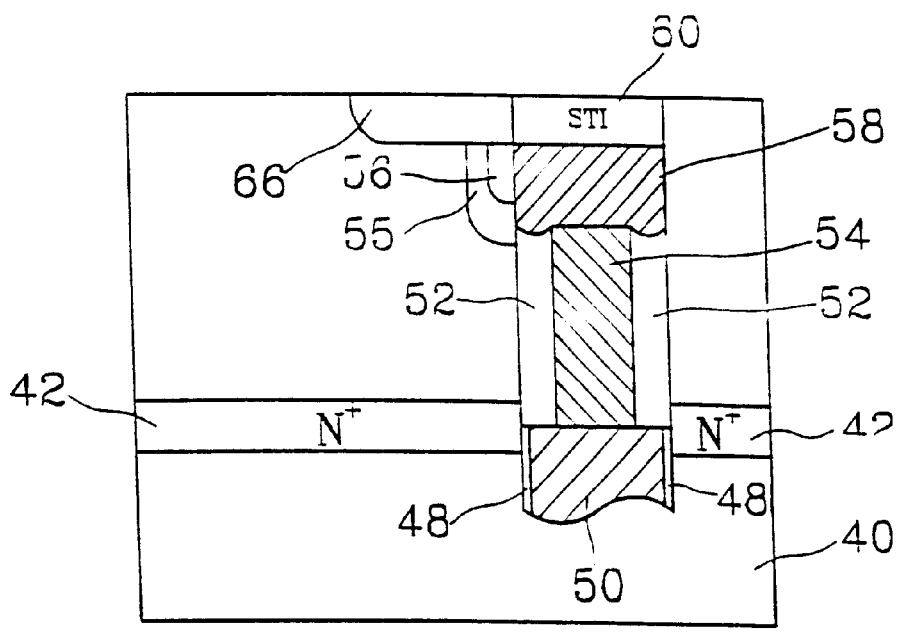
Figure 4:
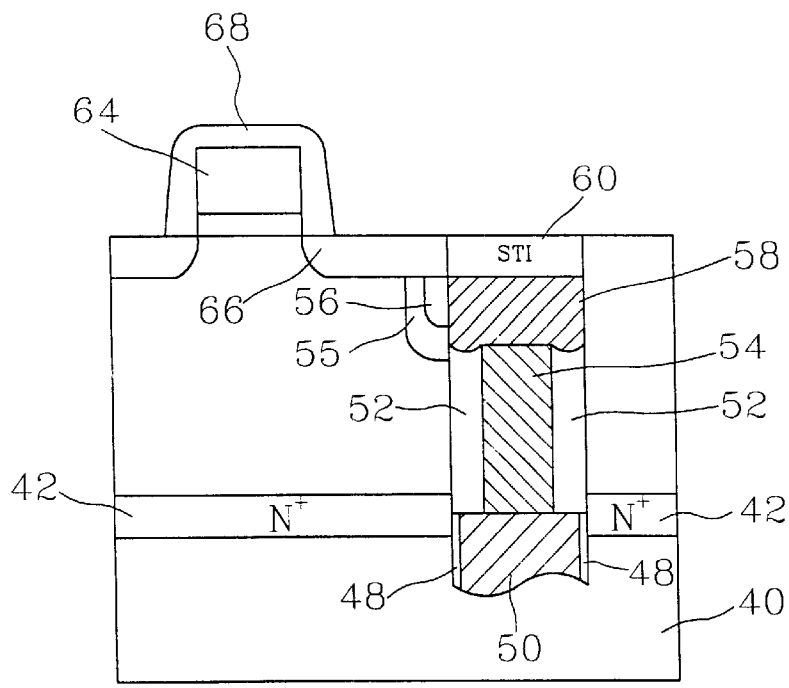

Referring now more particularly to FIGS. 2 to 4, there are shown the initial process sequences of the present invention, in which a trench capacitor with buried strap is fabricated on a P-type semiconductor silicon substrate 40.

Referring to FIG. 2, an $N^+$ buried plate well region 42 is first formed on a P-type semiconductor silicon substrate 40. Then, an oxide layer and a nitride layer (not shown in the figures) are sequentially deposited on the silicon substrate 40. The oxide layer and nitride layer layers are partially etched to open a process window for forming a trench by conventional lithography and plasma-etching techniques. Then, the exposed silicon substrate is also etched to form a trench. Next, a capacitor dielectric layer 48 is deposited inside the trench. A first polysilicon layer 50 as storage node is then deposited to fill the bottom of the trench. Thereafter, dielectric collars 52 are formed on the interior sidewalls of the trench. Next, a second polysilicon stud 54 is formed inside the trench. Dielectric collars 52 are then recessed to expose the contact area for the trench capacitor and the strap formed in subsequent step. Next, a two-step ion implantation is performed to form shallow strap 55 and deep strap 56 regions on one side of the trench as shown in FIG. 2. Alternatively, two-step ion implantation is performed first to form shallow and deep strap regions on one side of said trench, followed by collar dielectric recessing can also work.

The silicon substrate etching step is usually performed via plasma etching, using for example: magnetic enhanced reactive ion etching (MERIE), electron cyclotron etching (ECR) or reactive ion etching (RIE) methods with reactant gases such as $CF_4$, $CHF_3$ and Ar. The capacitor dielectric layer 48 is formed usually using oxide/nitride/oxide (ONO) compositive layer or even tantalum oxide ($Ta_2O_5$) high dielectric constant materials. The equivalent oxide thickness of the capacitor dielectric layer 48 is about 20 to 150 Angstroms.

The first polysilicon layer 50 and the second polysilicon layer 54 are usually formed by in-situ phosphorus or arsenic doped low pressure chemical vapor deposition (LPCVD) technique at a temperature range of about 550° C. to 630° C. to obtain a thickness of between 3000 to 5000 Angstroms. The dielectric collars 52 are usually made of sub atmosphere chemical vapor deposited (SACVD) Tetra-Ethyl-Ortho Silicate (TEOS), alternatively other types of oxides, nitride or even oxynitride may also work. The recessing walls of the dielectric collars are formed by anisotropic etching.

The two-step ion implantation of forming shallow strap 55 and deep strap 56 regions step is the key element of the present invention. Low energy ion implantation forms a shallow strap 55 region to reduce the contact resistance of straps and capacitor nodes as well as to increase the capacitor charge potential. On the other hand, high energy ion implantation forms a deep strap 56 region to cover the excess collar recesses. The junction leakage therefore can be minimized. The two-step ion implantation of the present invention is usually doped with phosphorus ($P^{31}$) ions. The low energy implantation is performed at an energy of 10 to 40 KeV, and a dose between about 1E13 to 5E14 $cm^{-2}$, while the high energy implantation is performed at an energy of 25 to 60 KeV, and a dose between about 1E13 to 5E14 $cm^{-2}$. The exact implantation order of this two-step ion implantation can be switched to still achieve same effect of the present invention.

Referring now to FIG. 3, a third polysilicon layer 58 is deposited overlaying the dielectric collars 52 and second polysilicon stud 54 inside the trench. Finally, a shallow trench isolation (STI) layer 60 is formed overlaying the third polysilicon layer 58 to complete a buried strap formation of trench capacitor as shown in FIG. 3. The shallow trench isolation (STI) layer 60 is usually made of LPCVD TEOS or high density plasma (HDP) chemical vapor deposited oxide to isolate adjacent devices.

Referring now to FIG. 4, following trench capacitor formation, an access transistor consisting of gate oxide 62, gate 64, and source/drain 66 are formed to finish a DRAM cell formation. A cap dielectric layer 68 may be formed covering the gate to provide better isolation. The charges are flown through a path between the trench capacitor and access transistor to charged or discharge the capacitor, that is, performing data writing and reading functions of a DRAM cell.

Alternatively, the two-step ion implantation of the present invention can be employed to form a trench capacitor with surface strap. The trench capacitor structure is still consisting of a capacitor dielectric layer 48, a first polysilicon storage node 50, a second polysilicon stud 54, a third polysilicon layer 58 and dielectric collars 52 as described before.

Figure 5:
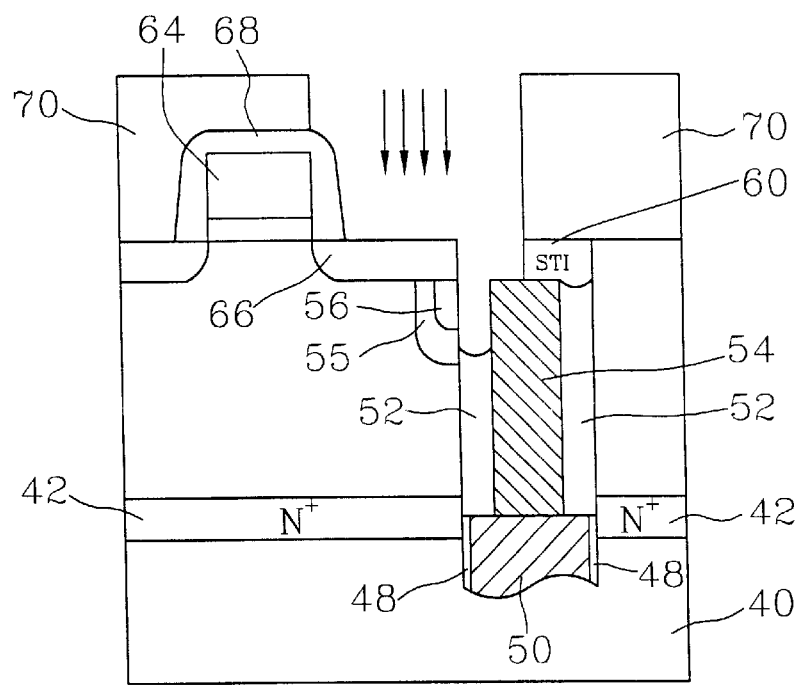
FIGS. 5 and 6 schematically illustrate the process sequences of a trench capacitor with surface strap for a DRAM cell according to the alternative embodiment of the present invention.

Referring now to FIG. 5, an N$^+$ buried plate well region 42 is first formed on a P-type semiconductor silicon substrate 40. Then, an oxide layer and a nitride layer (not shown in the Figures) are continuously deposited on the silicon substrate 40. The oxide layer and nitride layer layers are partially etched to open a process window for forming a trench by conventional lithography and plasma-etching techniques. Then, the exposed silicon substrate is also etched to form a trench. Next, a capacitor dielectric layer 48 is deposited inside the trench. A first polysilicon layer 50 as storage node is then deposited to fill the bottom of the trench. Thereafter, dielectric collars 52 are formed on the interior sidewalls of the trench. Next, a second polysilicon stud 54 is formed and etchback inside the trench. A shallow trench isolation (STI) layer 60 is formed overlaying the dielectric collars 52 and second polysilicon stud 54 inside the trench. Next, an access transistor consisting of gate oxide 62, gate 64, and source/drain 66 are formed. A cap dielectric layer 68 may be formed to provide better isolation. An interlayer dielectric (ILD) layer 70 composed of boronphosphosilicate glass (BPSG) is deposited over the entire silicon substrate. The ILD layer 70, STI layer 60 and one side of dielectric collars 52 are then partially etched to expose a strap implantation window for subsequent step. Next, two-step ion implantation is performed to form shallow strap 55 and deep strap 56 regions as shown in FIG. 5.

The two-step ion implantation of the alternative embodiment is usually doped with phosphorus (P$^{31}$) ions. The low energy implantation is performed at an energy of 10 to 40 KeV, and a dose between about 1E13 to 5E14 cm$^{-2}$, while the high energy implantation is performed at an energy of 25 to 60 KeV, and a dose between about 1E13 to 5E14 cm$^{-2}$.

Figure 6:
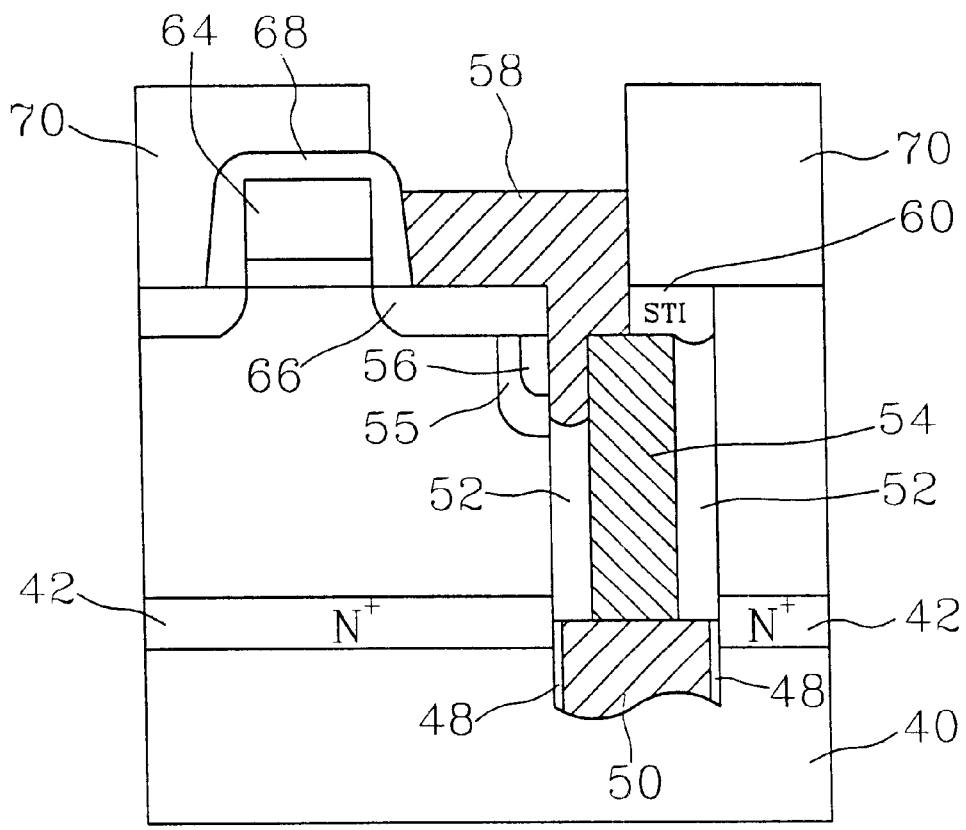

Referring now to FIG. 6, a third polysilicon layer 58 is deposited filling into implantation window. The third polysilicon layer 58 electrically contacts with the drain of the access transistor. The trench capacitor with surface strap according to the alternative embodiment of the present invention is finally accomplished. The charges are also flown through a path between the trench capacitor and access transistor to be charge or discharge the capacitor, that is, performing data writing and reading functions of a DRAM cell.

The method for forming trench capacitors via two-step ion implantation according to this invention has the following advantages:

1. Low energy ion implantation forms a shallow strap region to reduce the contact resistance of straps and capacitor nodes as well as to increase the capacitor charge potential. The retention fails due to marginal signal thus can be improved.

2. High energy ion implantation forms a deep strap 56 region to increase the junction depth of the strap to cover the excess collar recesses. The junction leakage therefore can be minimized.

While the invention has been particularly shown and described with reference to a preferred embodiment, it will be understood by those skilled in the art that various changes in form and detail may be made therein without departing from the spirit and scope of the present invention.

What is claimed is:

1. A method of fabricating a trench capacitor of a DRAM cell, comprising the steps of:
   (a) providing a semiconductor substrate, and then forming a trench on said semiconductor substrate;
   (b) sequentially forming a capacitor dielectric layer, a first polysilicon storage node, dielectric collars and a polysilicon stud inside said trench;
   (c) performing a two-step ion implantation to form shallow and deep strap regions on one side of said trench, wherein said deep strap region encompasses a bottom and a side of said shallow strap region;
   (d) forming a third polysilicon layer and an isolation layer overlaying said dielectric collars and said second polysilicon stud inside said trench to complete a buried strap formation, wherein said third polysilicon layer electrically contacts to said shallow strap region; and
   (e) forming a field effect transistor on said semiconductor substrate, wherein said shallow and deep strap regions electrically contact to a drain of said field effect transistor.

2. The method of claim 1, wherein said two-step ion implantation is doped with phosphorus (P$^{31}$) ions.

3. The method of claim 1, wherein said two-step ion implantation is using a high energy implantation and a low energy implantation to form a deep strap region and a shallow strap region, respectively.

4. The method of claim 3, wherein said low energy implantation is performed at an energy of 10 to 40 KeV, and a dose between about 1E13 to 5E14 cm$^{-2}$.

5. The method of claim 3, wherein said high energy implantation is performed at an energy of 25 to 60 KeV, and a dose between about 1E13 to 5E14 cm$^{-2}$.

6. A method of fabricating a trench capacitor of a DRAM cell, said method comprising the steps of:
   (a) providing a semiconductor substrate, and then forming a trench on said semiconductor substrate;
   (b) sequentially forming a capacitor dielectric layer, a first polysilicon storage node, dielectric collars and a second polysilicon stud inside said trench;
   (c) forming an isolation layer overlaying said dielectric collars and second polysilicon stud inside said trench;
   (d) forming a field effect transistor on one side of said trench, and then forming an interlayer dielectric layer over the entire semiconductor substrate;
   (e) etching said interlayer dielectric layer, isolation layer and one side of dielectric collars to open an implantation window;
   (f) performing two-step ion implantation to form shallow and deep strap regions on the same side of said field effect transistor, wherein said shallow and deep strap regions electrically contact to a drain of said field effect transistor;
   (g) forming a third polysilicon layer overlaying the substrate surface not covered by the remaining of said interlayer dielectric layer and isolation layer to complete a surface strap formation.

7. The method of claim 6, wherein said two-step ion implantation is doped with phosphorus (P$^{31}$) ions.

8. The method of claim 6, wherein said two-step ion implantation is using a high energy implantation and a low energy implantation to form a deep strap region and a shallow strap region, respectively.

9. The method of claim 8, wherein said low energy implantation is performed at an energy of 10 to 40 KeV, and a dose between about 1E13 to 5E14 $cm^{-2}$.

10. The method of claim 8, wherein said high energy implantation is performed at an energy of 25 to 60 KeV, and a dose between about 1E13 to 5E14 $cm^{-2}$.

* * * * *